(12) United States Patent
Shi et al.

(10) Patent No.: US 7,550,235 B2
(45) Date of Patent: Jun. 23, 2009

(54) METHOD AND APPARATUS FOR PERFORMING MODEL BASED PLACEMENT OF PHASE-BALANCED SCATTERING BARS FOR SUB-WAVELENGTH OPTICAL LITHOGRAPHY

(75) Inventors: Xuelong Shi, San Jose, CA (US); Jang Fung Chen, Cupertino, CA (US); Thomas Laidig, Point Richmond, CA (US); Kurt E. Wampler, Sunnyvale, CA (US); Douglas Van Den Broeke, Sunnyvale, CA (US)

(73) Assignee: ASML Masktools B.V., Ah Veldhoven (NL)

( * ) Notice: Subject to any disclaimer, the term of this patent is extended or adjusted under 35 U.S.C. 154(b) by 718 days.

(21) Appl. No.: 10/933,496

(22) Filed: Sep. 3, 2004

(65) Prior Publication Data

US 2005/0142449 A1 Jun. 30, 2005

Related U.S. Application Data

(60) Provisional application No. 60/500,260, filed on Sep. 5, 2003.

(51) Int. Cl.
*G03F 1/02* (2006.01)
(52) U.S. Cl. .............................. 430/5; 716/19; 716/21; 382/144
(58) Field of Classification Search .................. 430/5; 716/21, 19
See application file for complete search history.

(56) References Cited

U.S. PATENT DOCUMENTS

| 5,229,230 | A | 7/1993 | Kamon |
| 5,663,893 | A | 9/1997 | Wampler et al. |
| 5,682,323 | A | 10/1997 | Pasch et al. |
| 5,895,741 | A | 4/1999 | Hasegawa et al. |
| 6,214,497 | B1 | 4/2001 | Stanton |

(Continued)

FOREIGN PATENT DOCUMENTS

| EP | 1 202 119 A1 | 5/2002 |
| EP | 1 237 046 A2 | 9/2002 |
| JP | 60234320 A * | 11/1985 |
| WO | WO 03/054626 A1 | 7/2003 |

OTHER PUBLICATIONS

Christoph Dolainsky, et al., "Simulation based method for sidelobe suppression," Optical Microlithography XIII, Proceedings of SPIE, 2000, pp. 1156-1162, vol. 4000.

(Continued)

*Primary Examiner*—Mark F Huff
*Assistant Examiner*—Rashid Alam
(74) *Attorney, Agent, or Firm*—Pillsbury Winthrop Shaw Pittman LLP (57) ABSTRACT

A method of generating a mask design having optical proximity correction features disposed therein. The methods includes the steps of obtaining a desired target pattern having features to be imaged on a substrate; determining a first interference map based on the target pattern, which defines areas of constructive interference between at least one of the features to be imaged and a field area adjacent the at least one feature; placing a first set of assist features having a first phase in the mask design based on the areas of constructive interference defined by the first interference map; determining a second interference map based on the first set of assist features, which defines areas of constructive interference between assist features of the first set of assist features and a field area adjacent at least one of the assist features of the first set of assist features; and placing a second set of assist features having a second phase in the mask design based on the areas of constructive interference defined by the second interference map, wherein the first phase does not equal the second phase.

12 Claims, 10 Drawing Sheets

U.S. PATENT DOCUMENTS

| | | | |
|---|---|---|---|
| 6,223,139 | B1 | 4/2001 | Wong et al. |
| 6,303,253 | B1 | 10/2001 | Lu |
| 6,355,382 | B1 * | 3/2002 | Yasuzato et al. ............... 430/5 |
| 6,413,684 | B1 | 7/2002 | Stanton |
| 6,519,760 | B2 | 2/2003 | Shi et al. |
| 6,777,141 | B2 | 8/2004 | Pierrat |
| 6,787,271 | B2 | 9/2004 | Cote et al. |
| 6,792,591 | B2 * | 9/2004 | Shi et al. ....................... 716/19 |
| 6,807,662 | B2 | 10/2004 | Toublan et al. |
| 6,964,032 | B2 * | 11/2005 | Liebmann et al. ............. 716/19 |
| 2002/0083410 | A1 | 6/2002 | Wu et al. |
| 2002/0152452 | A1 | 10/2002 | Socha |
| 2002/0157081 | A1 | 10/2002 | Shi et al. |
| 2003/0082463 | A1 * | 5/2003 | Laidig et al. ................... 430/5 |
| 2003/0152843 | A1 * | 8/2003 | Tang ............................. 430/4 |
| 2003/0228541 | A1 | 12/2003 | Hsu et al. |
| 2004/0122636 | A1 | 6/2004 | Adam |

OTHER PUBLICATIONS

Kyoji Nakajo, et al., "Auxiliary pattern generation to cancel unexpected images at sidelobe overlap regions in attenuated phase-shift masks," Sep. 1999.

Nicolas Bailey Cobb, "Fast Optical and Process Proximity Correction Algorithms for Integrated Circuit Manufacturing," Ph.D. dissertation, Spring 1998, pp. 35-72, University of California at Berkeley.

J. Fung Chen, et al., "Practical I-Line OPC Contact Masks for Sub-0.3Micron Design Rule Applciation: Part 1—OPC Design Optimization," pp. 181-201, 1997.

J.A. Torres, et al., "Contrast-Based Assist Feature Optimization," Optical Microlithography XV, 2002, pp. 179-187, Proceedings of SPIE, vol. 4691, SPIE.

Olivier Toublan, et al., "Fully Automatic Side Lobe Detection and Correction Technique for Attenuated Phase Shift Masks," Optical Microlithography XIV, 2001, pp. 1541-1547, Proccedings of SPIE, vol. 4346, SPIE.

Michael S. Yeung, "Extension of the Hopkins theory of partially coherent imaging to include thin-film interference effects," Optical/Laser Microlithography VI, 1993, pp. 452-463, SPIE, vol. 1927.

Douglas Van Den Broeke, et al., "Near 0.3 $k_1$ Full Pitch Range Contact Hole Patterning Using Chromeless Phase Lithography (CPL)," Proceedings of the SPIE, Sep. 9, 2003, pp. 297-308, vol. 5256, SPIE.

* cited by examiner

METHOD AND APPARATUS FOR PERFORMING MODEL BASED PLACEMENT OF PHASE-BALANCED SCATTERING BARS FOR SUB-WAVELENGTH OPTICAL LITHOGRAPHY

CLAIM OF PRIORITY

This patent application, and any patent(s) issuing therefrom, claims priority from U.S. provisional patent application No. 60/500,260, filed on Sep. 5, 2003, entitled "A Model Based Placement of Phase-Balanced Scattering Bars to Achieve Lithography Patterning Requirements for Sub-wavelength Pitch Features" which is incorporated herein by reference in its entirety.

FIELD OF THE INVENTION

The present invention relates to photolithography, and in particular relates to a method of applying optical proximity correction features to mask layouts utilizing an interference map. In addition, the present invention relates to a device manufacturing method using a lithographic apparatus comprising a radiation system for providing a projection beam of radiation; a mask table for holding a mask, serving to pattern the projection beam; a substrate table for holding a substrate; and a projection system for projecting the patterned projection beam onto a target portion of the substrate.

BACKGROUND OF THE INVENTION

Lithographic projection apparatus (tools) can be used, for example, in the manufacture of integrated circuits (ICs). In such a case, the mask contains a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing. Thereafter, the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The lithographic tool may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic tools are described, for example, in U.S. Pat. No. 5,969,441 and WO 98/40791, incorporated herein by reference.

The photolithography masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD (critical dimension) of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

Patterning IC device features with size and pitch dimensions well below exposure wavelength on the resist-coated wafers with sufficient process latitude has become a significant manufacturing challenge today. With unforeseen economical and technical challenges for the next generation lithography, the semiconductor industry has become more interested in extending the existing exposure wavelength technology. According to the following Raleigh Criterion, if one is to use the same exposure wavelength, in order to shrink the design rule minimum feature pitch from one generation to the next, either a higher numerical aperture exposure tool or a lower k1 parameter must be utilized. In the last 20 years, the parameter k1 has been generally regarded as the lithography process capability. The lower k1, the more difficult the process becomes. The minimum pitch can be defined as:

$$\frac{1}{2} \text{Minimum Pitch} = k_1 \left( \frac{\text{Wavelength}}{\text{Numerical Aperture}} \right)$$

While the industry has been pushing exposure tool suppliers to develop very high numerical aperture exposure tools (NA>0.90), it is also searching for methods to allow process capabilities to achieve lower k1 for manufacturing. It is clear that low k1 photolithography methods are now the mainstream for semiconductor manufacturing. Among the many low k1 techniques, the use of high NA and off-axis illumination (OAI) in combination with binary or phase-shifted masks (PSM) with optical proximity correction (OPC) are known. The scattering bar (SB) or assist feature OPC is particularly attractive and has been used in actual manufacturing since it is economical and can be effectively applied to all critical masking layers in both clear and dark field mask types.

As explained in detail, for example, in U.S. Pat. Nos. 5,242,770 and 5,447,810, SB OPC refers to sub-resolution assist features which are added to the original design features on the mask. The SBs operate to enhance the printing of main features, but the SBs themselves should not be printable. As such, SBs interact with main features within optical proximity range to enhance the printing of the main feature, while the SBs themselves are not printable. This is feasible in part by carefully adjusting the width of SB features to be below the printing resolution and also by taking the advantage of the non-linear response of photoresist. In order to achieve the greatest benefit from the deployment of SBs, the placement of the SB must be optimized. For line or trench structures, SB placement rules can be developed in a rather straightforward manner.

However, in order to meet the printing performance requirement for pitch features at sub-wavelength for any two-dimensional (2D) features such as contact or via holes, it is currently not possible to achieve satisfactory printing performance based on the existing rule-based methods. This is due to the fact that it is extremely difficult to apply a rule-based approach to achieve optimum placement of SBs for enhancing, for example, the printing of sub-wavelength pitch contact holes.

A model-based, automatic placement approach for applying SBs to a mask design has been investigated as a possible solution to the foregoing problem associated with utilizing a rule-based approach. For example, U.S. patent application Ser. No. 10/756,830 filed on Jan. 1, 2004, and Ser. No. 10/878,490 filed Jun. 29, 2004, both of which are assigned to the assignee of the instant application, and which are both incorporated herein by reference in their entirety, disclose a concept of placing SBs and non-printable phase features in the mask design utilizing interference maps (IM). While the concept has been demonstrated feasible for manufacturing purposes, it can still be a challenging process to apply the concepts into a manufacturing worthy implementation, especially when dealing with complex mask designs.

Accordingly, there remains a need for a method of applying SBs to a mask design based on interference maps generated from the target mask design which simplifies the application process and which further improves printing performance.

SUMMARY OF THE INVENTION

In an effort to solve the foregoing needs, it is one object of the present invention to provide a systemic method of implementation for automatically applying the phase-balanced SB features to a mask design based on the interference map associated with the given mask design utilizing a model-based approach. Further, it has been determined that non-printable 0-phase SB features must be balanced with non-printable π-phase SB features in order to ensure the non-printability of the 0-phase SB features, and to prevent a reduction in the printing process latitude for the main design features. The model-based approach of the present invention allows provides for the placement of such π-phase SB features.

More specifically, the present invention relates to a method of generating a mask design having optical proximity correction features disposed therein. The method includes the steps of obtaining a desired target pattern having features to be imaged on a substrate; determining a first interference map based on the target pattern, which defines areas of constructive interference between at least one of the features to be imaged and a field area adjacent the at least one feature to be imaged; placing a first set of assist features having a first phase in the mask design based on the areas of constructive interference defined by the first interference map; determining a second interference map based on the first set of assist features, which defines areas of constructive interference between assist features of the first set of assist features and a field area adjacent at least one of the assist features of the first set of assist features; and placing a second set of assist features having a second phase in the mask design based on the areas of constructive interference defined by the second interference map, wherein the first phase does not equal the second phase.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a) A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from United States Patents U.S. Pat. No. 5,296,891 and U.S. Pat. No. 5,523,193, which are incorporated herein by reference.

b) A programmable LCD array. An example of such a construction is given in United States Patent U.S. Pat. No. 5,229,872, which is incorporated herein by reference.

The method of the present invention provides important advantages over the prior art. Most importantly, the method of the present invention provides a systemic method for automatically applying the phase-balanced SB features to a mask design based on the interference map associated with the given mask design utilizing a model-based approach. The application of the phase-balanced assist features in accordance with the present invention, allows for the benefit of enhanced imaging of the target features, while preventing a degradation in the process window, by minimizing the likelihood hood that the assist features enhancing the imaging of the target features will be imaged by placing additional assist features having an opposite phase in the mask layout so as to phase balance the assist features enhancing the imaging of the target features.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

DETAILED DESCRIPTION OF THE INVENTION

As explained in more detail below, the OPC technique of the present invention allows for a full-pitch range of deep sub-wavelength mask patterns to be imaged utilizing substantially any illumination condition. In general, the OPC technique entails generating an interference map (IM) based on the mask design (i.e., target pattern), which indicates how each point in the field surrounding the desired target pattern interacts with the target pattern. The possibilities are that a given point either constructively interferes, destructively interferes or is neutral (i.e., neither constructive or destructive interference) with respect to the target pattern. Once the IM is generated, it is utilized to determine where 0-phase assist features (i.e., SBs) are positioned in the mask design so as to enhance the imaging of the target features. Next, a second IM is generated based on the placement of the 0-phase assist features, which indicates how each point in the field surrounding the 0-phase assist features interacts with one another. Then, π-phase assist features are placed in locations in which the 0-phase assist features are interacting constructively with one another (i.e., at locations other than the desired target features) so as to locally phase balance the 0-phase assist features and further reduce the likelihood of the 0-phase assist features being printed on the substrate. The phases of the SBs are defined with respect to the main features, therefore, 0-phased SBs have the exact same phase as the main features, for example, the contacts; while π-phased SBs have 180 degrees of phase difference relative to the main features. The creation of the π-phased SBs can be realized, for example, either through etching the mask substrate with accurate depth or through the use of phase-shifting materials.

Figure 1:
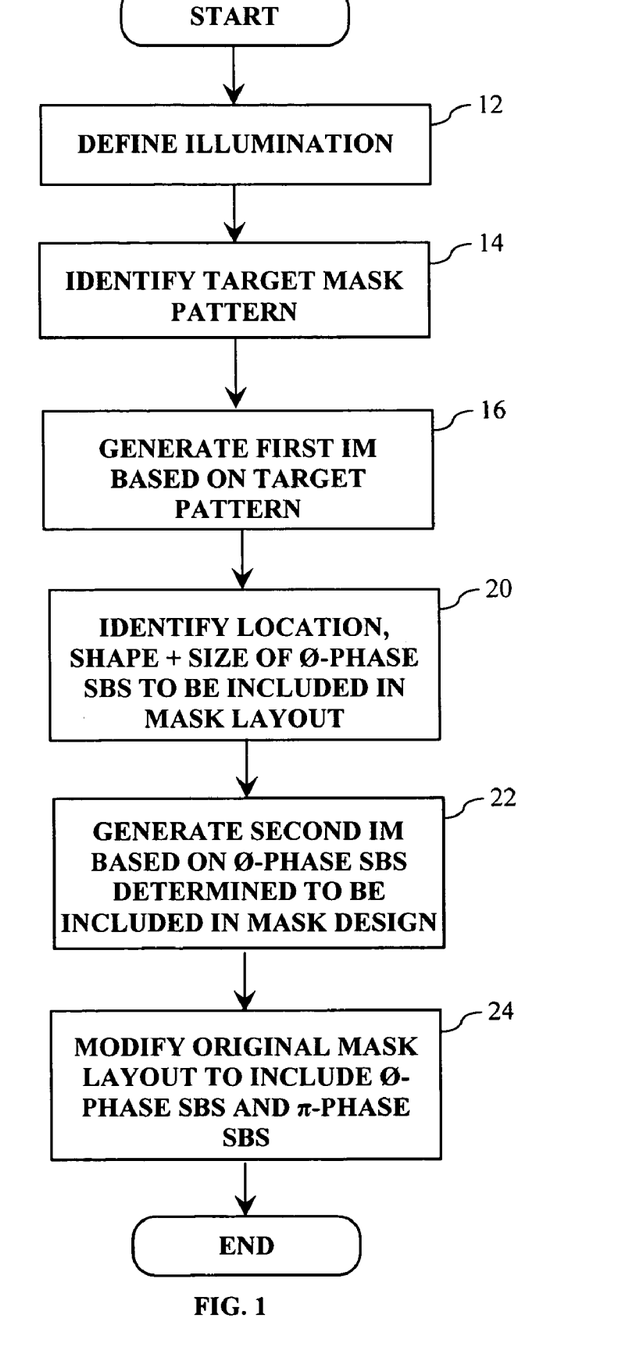
FIG. 1 is an exemplary flowchart illustrating the method of applying SBs to a mask pattern in accordance with the present invention.
Figure 2:
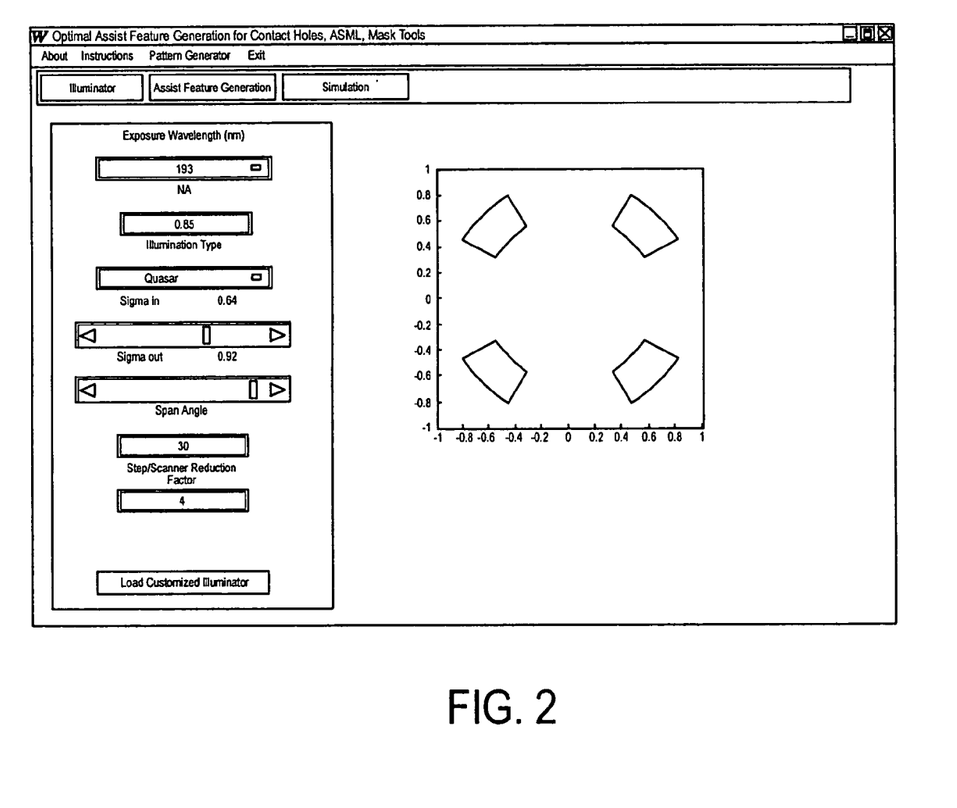
FIG. 2 illustrates an exemplary Quasar illumination utilized in the example set forth below to describe the method of the present invention.

FIG. 1 is an exemplary flowchart detailing the steps in the foregoing process. This process will be described utilizing an example of a contact hole target pattern. Referring to FIG. 1, the first step (Step 12) in the process is to define the illumination and settings of the optical imaging system that will be utilized to image the mask. As is known, the optimum placement of SB features (also referred to as assist features) depends on the illumination and other optical settings (e.g., NA, $\sigma_{in}$, $\sigma_{out}$, etc.). The method of the present invention can be utilized with substantially any illumination, including highly coherent on-axis (partial coherence <0.4) and strong off-axis illuminations (such as, for example, Quasar, C-Quasar, double dipole, and single dipole illumination), or a customized illumination type. The illumination utilized in the current example is a typical Quasar illumination having an exposure wavelength, λ=193 nm; NA=0.85; $\sigma_{in}$=0.64 and $\sigma_{out}$=0.92, as shown in FIG. 2.

Figure 3:
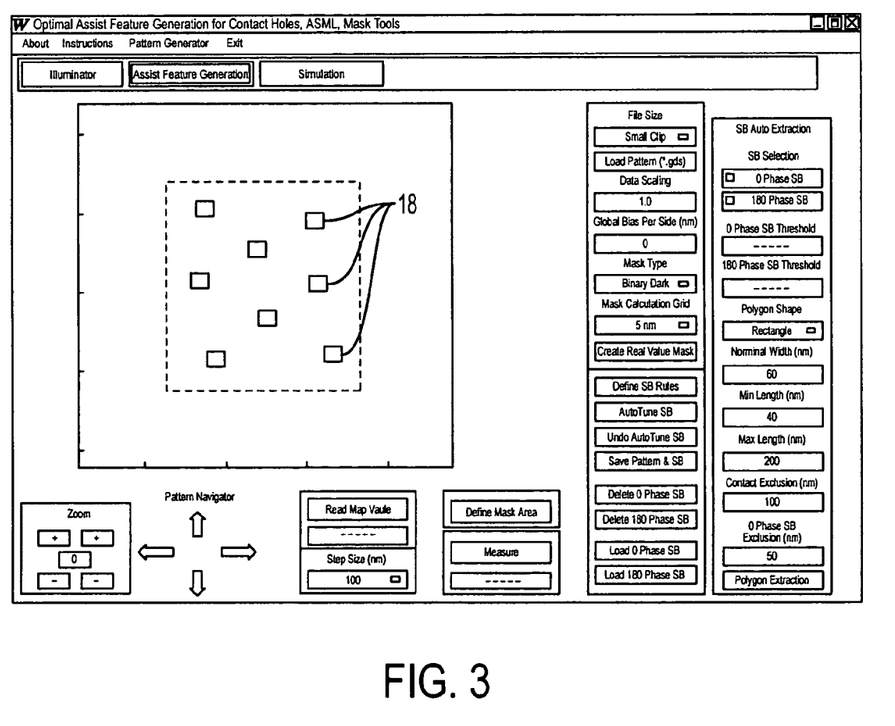
FIG. 3 illustrates an exemplary contact hole pattern having randomly spaced contact holes.

The next step (Step 14) in the process is to identify the target mask pattern to which SBs are to be added. It is noted that the method of the present invention will typically be implemented in a computer program, such as MaskWeaver™ offered for sale by ASML MaskTools, Inc., so as to allow the process of the present invention to be performed in a substantially automated manner. Once the target pattern is input into the computer or processor, the operator can either identify which portion of the target pattern the SBs should be applied to, or have the SBs applied to all portions of the target pattern. FIG. 3 illustrates an exemplary contact hole pattern having randomly spaced contact holes 18 to be imaged on the substrate.

Once the target mask pattern is input, the next step (Step 16) in the process is to generate an interference map based on the target pattern. The exemplary contact hole pattern shown in FIG. 3 will be utilized to illustrate the process. Physically, the interference map is essentially an electric field (E-field) distribution at the time of exposure as formed by the target design features utilizing the defined illumination conditions and settings. By utilizing this E-field distribution, it is possible to extract the relative phase information necessary for the optimum placement of SB features. In other words, the IM indicates at each point (e.g., a grid point) in an optical region of interest for any given pattern whether transmitted light at that point will interfere constructively with the desired target pattern (thereby making the intensity of the transmitted light on the target pattern greater), destructively (thereby making the intensity of the transmitted light on the target pattern lower), or neutral (not altering the intensity of the transmitted light on the target pattern). It is noted that the IM can be generated utilizing numerous methods, for example, using a conventional aerial image simulator as disclosed in U.S. patent application Ser. No. 10/756,830 filed on Jan. 1, 2004, or an eigenvalued image model kernel as disclosed in U.S. Provisional Patent Application Ser. No. 60/530,656 filed on Dec. 19, 2003, both of which are incorporated herein by reference in their entirety.

Furthermore, because the illumination is partially coherent in practical photolithography, the E-field distribution (or interference map) for a given mask pattern can be understood in a statistical sense. In other words, the phase relationship of the interference map at different locations is statistically stationary.

Figure 4:
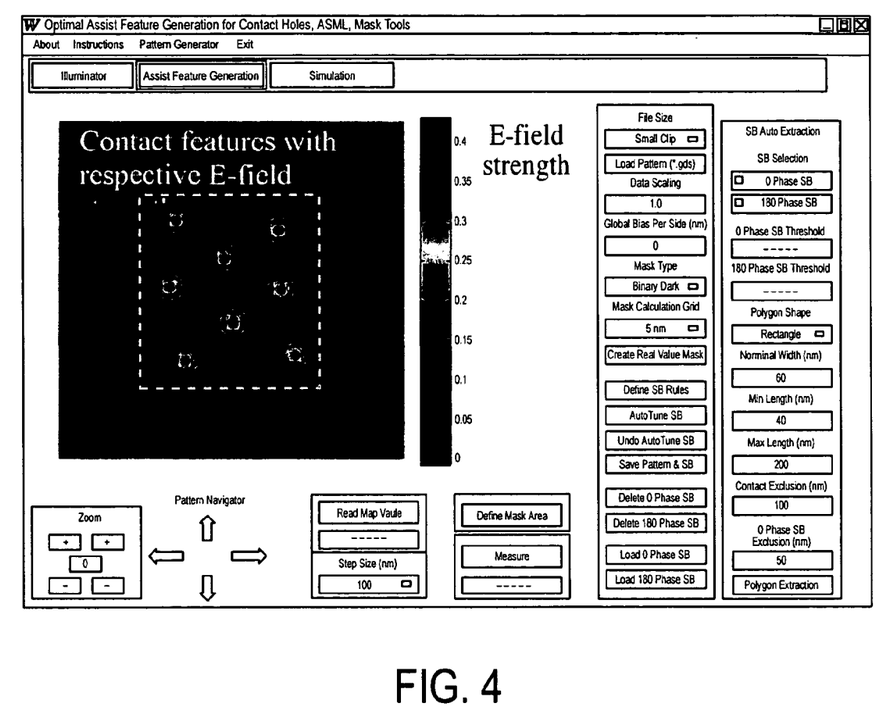
FIG. 4 illustrates an illumination map generated from the target contact hole pattern shown in FIG. 3 under the predefined illumination conditions illustrated in FIG. 2.
Figure 5:
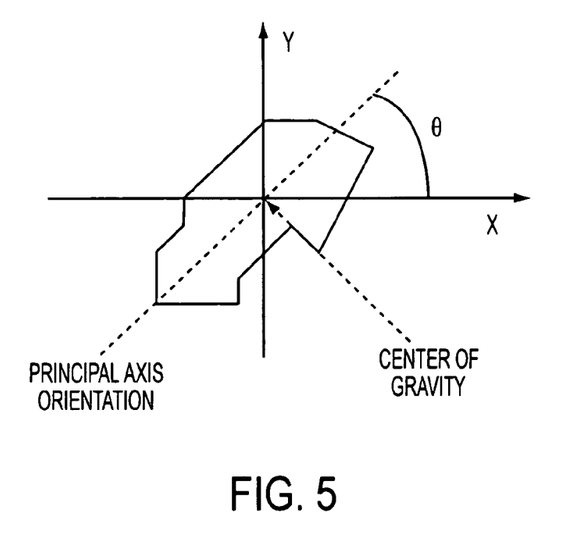
FIGS. 5 and 6(a)-6(e) illustrate methods for extracting the SB features from the illumination map.
Figure 6A:
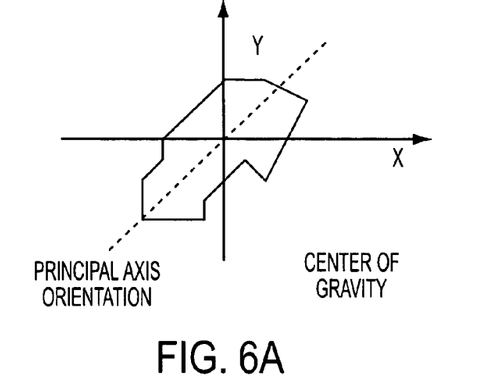
Figure 6B:
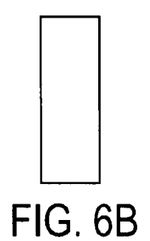
Figure 6C:
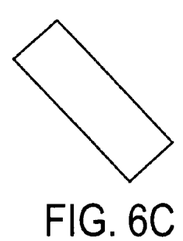
Figure 6D:
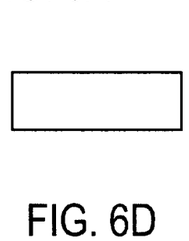
Figure 6E:
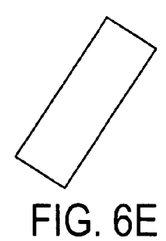

The E-field distribution or illumination map associated with the target contact hole pattern shown in FIG. 3 under the predefined illumination conditions illustrated in FIG. 2 is shown in FIG. 4. Once the IM is generated for the target pattern, the next step (Step 20) in the process is to extract or identify the locations in the mask layout where 0-phase SB should be positioned, along with the shape of the SB at each given location. It is noted that it is possible for the shape and size of each 0-phase SB to be different. Of course, it is also possible the SB to have the same shape and size, with the orientation of the SB within the mask layout being variable.

As noted, the interference map illustrates the phase relationship and the relative interaction strength of the target contact hole mask pattern during the exposure. If the phases of the E-field at the main contact features 18 are maintained as a reference point at 0, any 0-phase SB feature placed at a location that has positive E-field value will interact with the neighboring contact holes 18 to be printed in a constructive manner. In other words, the SB features placed in these locations will act to enhance the printing of the main contact hole features 18. In one embodiment, the 0-phase areas suitable for SB placement can be outlined by a contour with a fixed E-field value threshold setting of the IM.

It is noted that there are several ways to extract the SB features from such an interference map. The extraction refers to the process of generating regular-shaped polygons based on the contoured areas that have been identified as the optimum locations for SB placement. From the mask manufacturing perspective, it is best to have the extracted SB features conform to the manufacturing restrictions as defined by the tool to be utilized to actually fabricate the mask. The restrictions can be expressed, for example, in terms of SB feature dimension and shape. In the given example, the rectangle shape and octagon shape SB features are demonstrated. However, the present invention is not limited to these shapes. Other shapes are certainly applicable as long as it can be produced and inspected under the existing and/or by the future mask making processes to ensure the production worthy quality.

It is also noted that it is undesirable to have an excessive number of SB features contained in the mask design, because this will increase the feature count in the mask data, and as is known, an excessive feature count can become too burdensome to manage during the mask making process. Further, excessive SB features are also likely to cause an adverse effect when performing the step of balancing the 0-phased SBs. As such, it is preferable to only extract/identify the areas that provide significant constructive interference from the IM (and place 0-phased SBs in these areas) by utilizing an optimally defined threshold setting. Typically, the optimization process (to define a threshold which does not result in an excessive number of areas on the IM being identified as requiring a 0-phased SB) will require some trial and error to determine an optimum E-field threshold setting to define the contours of interest (i.e., areas to receive 0-phased SBs).

Once the areas of the mask layout in which 0-phased SBs are to be positioned are defined, the orientation (i.e., shape) of each of the SB features must be determined by one of numerous available methods. U.S. patent application Ser. No. 10/878,490, filed on Jun. 29, 2004, which is incorporated herein by reference in its entirety, discloses numerous methods for extracting SBs from an IM. Two such methods are: 1) by calculating the orientation of the principal axis of the "candidate" islands of the defined contours, or 2) by calculating the integrations of the "candidate" islands of the defined contours with a set of designated mask shapes. FIGS. 5 and 6(a)-6(e) and the following equations illustrate both of these methods. For example, once the orientation of principal axis of the "candidate" island is calculated, a proper rectangle SB can be placed with correct orientation in the island so that optimal SB effect can be achieved under SB orientation constraints. The size of the SB is determined by the lengths of the two principal axes in combination with the predefined SB length and width constraints that are imposed by SB manufacturability and printability.

When utilizing the first method, in one technique to calculate the principal axis orientation, one first calculates the elements of the moments of inertia matrix utilizing the matrix:

$$I = \begin{bmatrix} I_{xx} & I_{xy} \\ I_{yx} & I_{yy} \end{bmatrix}$$

where:

$I_{xx} = \Sigma \rho_i x_i x_i$
$I_{xy} = \Sigma \rho_i x_i y_i$
$I_{yx} = \Sigma \rho_i y_i x_i$
$I_{yy} = \Sigma \rho_i y_i y_i$ and $\rho_i$ is the E-field value at location i.

The orientation angle, $\theta$ satisfies the following equation:

$$\theta = 0; \text{ if } I_{xy} = 0$$
$$\theta = \frac{\pi}{4}; \text{ if } I_{xx} = I_{yy}$$
$$\theta = \frac{1}{2} \tan^{-1}\left(\frac{2 I_{xy}}{I_{xx} - I_{yy}}\right); \text{ other cases}$$

If utilizing the second method, first, place the mask shape center at the center of gravity of the "candidate" island contour, and then sum the E-field values that are within the mask shape. Next select the mask shape with the orientation (A, B, C, or D) that gives the maximum sum of the E-field values. The selected mask shapes are the intended SB features. It is noted that because current mask manufacturing techniques typically utilize rectangles on the mask with orientations of {0,45,90,135} degrees of orientation, such rectangles are often a natural choice for SBs. However, as noted above, other shapes may be utilized to implement the SBs.

It is further noted that in order to prevent the possible printing of the SB features, a set of pre-defined restrictions (e.g., maximum width and length) on the extracted SB features determined from the IM can be imposed. For example, the definition of the minimum width and length can be defined in order to conform to mask making manufacturability, and be based on the imaging system and processing conditions that will be utilized to image the mask. In addition, an exclusion region around the desired contact hole can also be defined, in which it is impermissible to place SBs. Such an exclusion region prevents SBs from causing main feature distortion during printing.

Figure 7:
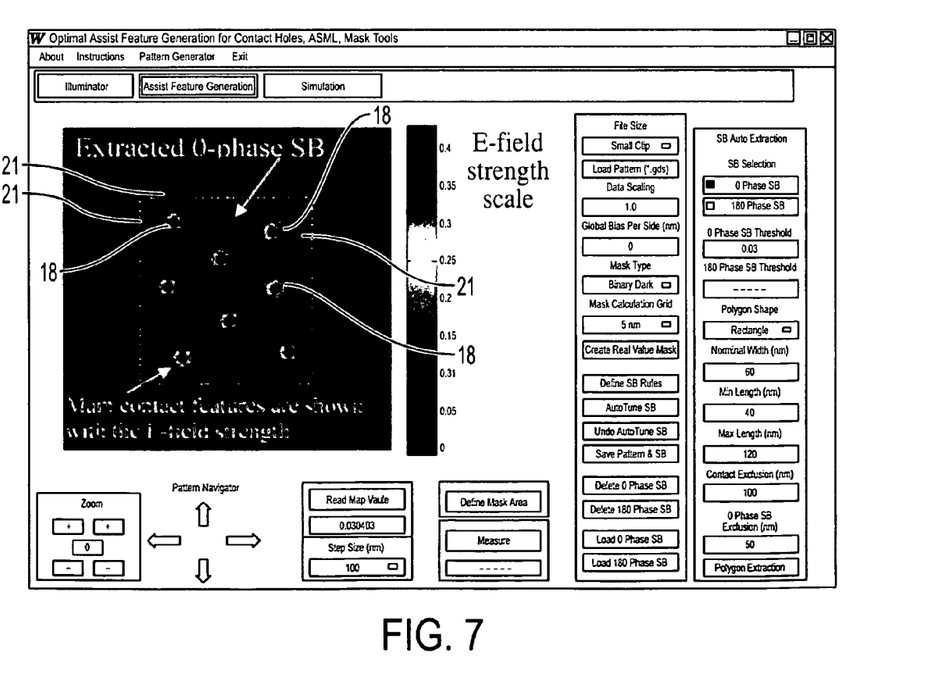
FIG. 7 illustrates an exemplary modified mask design containing the 0-phase SBs positioned adjacent the desired contact holes 18 in accordance with the method of the present invention.

FIG. 7 illustrates the modified mask design containing the 0-phase SBs 21 positioned adjacent the desired contact holes 18 in accordance with the foregoing method. The 0-phase SBs 21 are placed only in locations within the mask design having an e-field value exceeding the predetermined threshold which is determined in the manner set forth above. In the illustrated example, the method used to size and orient the 0-phase SBs is method no. 2 discussed above. It is noted that the 0-phase SB features 21 and the main contact hole features 18 have the same phase, which in this example is 0-phase shift, with respect to light transmitted through the features. This is so that the E-fields generated from 0-phase SB features 21 interact constructively with E-fields from the contact hole locations. As a result, the E-fields (and intensity levels) are strengthened in the main contact hole features 18, and the contact hole features 18 become more printable and with improved process latitude.

Theoretically, the dimension of the 0-phase SB features should be as large as possible so long as 0-phase SBs remain subresolution (i.e., the 0-phase SBs are not printable). However, as noted above, the 0-phase SB features 21 have e-field values that have the same sign as that of the E-fields from the main contact features 18. While this can enhance the printability of the main contact features 18, it must also be recognized that the optical interaction between these features is reciprocal. This means that the intensity levels of the 0-phase SB features 21 also become enhanced and more printable. As this is clearly undesirable, and must be prevented, the present invention utilizes π-phase SBs 23 to locally phase balance the 0-phase SB 21. In other words, in accordance with the present invention, in order to suppress the printing of the 0-phase SB features 21 while maintaining the benefit of a better printability for the main contact features, the mask design is further modified to include π-phase SBs 23.

More specifically, the method includes placing π-phase (or out-of-phase) SB features 23 in the neighborhood of the 0-phase counterpart SBs to locally "balance" the relative 0-π-phases. The important point is to ensure that the E-fields from phase-balanced SB features only interact destructively with each other while maintaining the constructive interactions between the 0-phase SB features 21 and the main contact holes 10.

Figure 8:
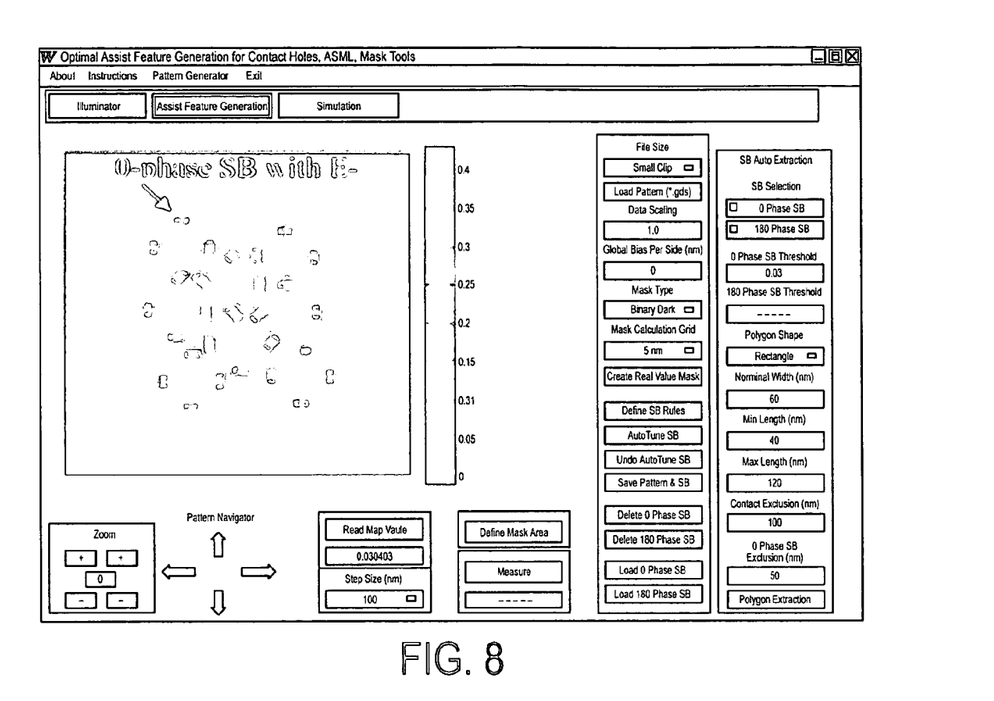
FIG. 8 illustrates the resulting IM generated from only the 0-phased SBs.

Placement of the π-phase SBs within the mask design is performed as follows. Referring again to FIG. 1, a second IM is generated based on only the 0-phase SBs determined to be included in the mask design (Step 22). The resulting IM identifies the locations within the mask layout in which light incident upon these locations constructively interferes with the printing of the 0-phase SBs 21. In accordance with the present invention, by placing π-phased SBs 23 at these locations, the π-phased SBs, which exhibit a 180 degree phase difference with respect to light transmission, function to negate or suppress the constructive interaction between the 0-phased SBs 21. It is noted that the π-phased SBs can be extracted from the IM in the same manner as the 0-phased SBs discussed above. FIG. 8 illustrates the resulting IM corresponding to only the 0-phased SBs defined in Step 20.

Once the π-phase SBs 23 have been extracted, the original mask layout (i.e., target pattern) is modified to include both the 0-phased SBs 21 and the π-phased SBs 23 (Step 24), and this mask having the desired contact holes 18, the 0-phased SB features 21 and the π-phased SB features 23 represents the actual mask pattern to be imaged.

Figure 9:
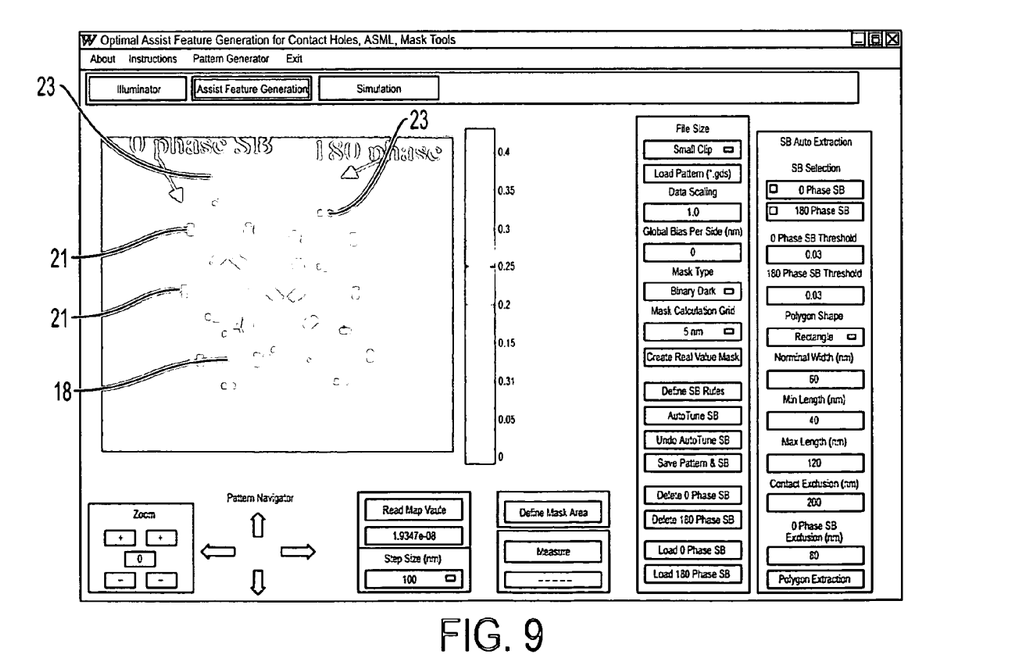
FIG. 9 illustrates an exemplary resulting mask layout with both 0-phase SB features 21 and π-phase SB features 23.
Figure 10:
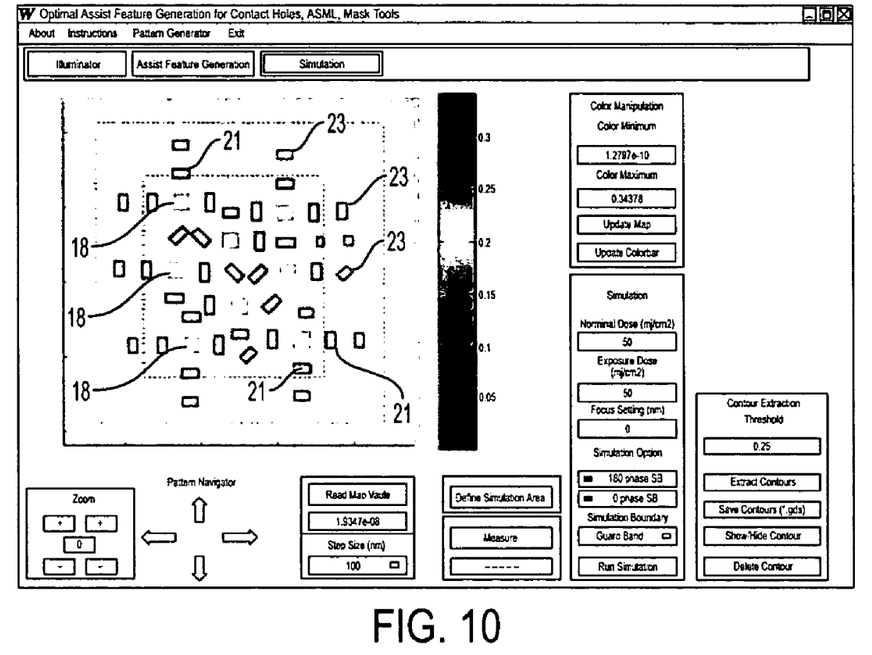
FIG. 10 shows the corresponding polygon plots of 0-phase SB features and π-phase SB features of the layout shown in FIG. 9.

FIG. 9 illustrates the resulting mask layout with both 0-phase SB features 21 and π-phase SB features 23 as extracted without any further fine-tuning, and FIG. 10 shows the corresponding polygon plots of 0-phase SB features 21 and π-phase SB features 23. In FIG. 10, bold green polygons are the π-phase SB features 23, bold black polygons are 0-phase SB features 21 and the remaining features are the main contact hole square features 18.

Figure 11:
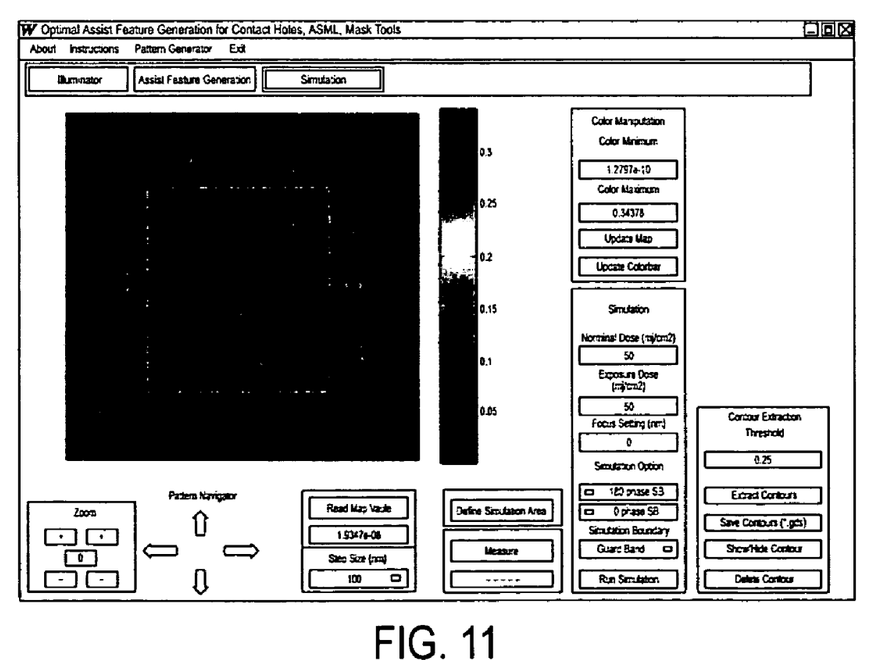
FIG. 11 shows the intensity levels of the main contact features without the phase-balanced SB features of the present invention applied to the original mask layout.
Figure 12:
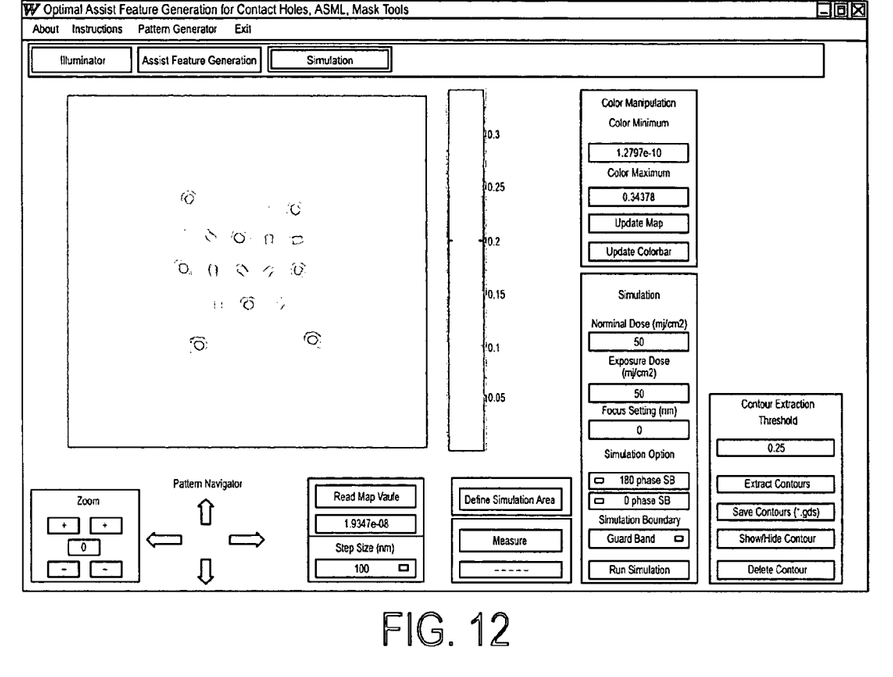
FIG. 12 illustrates the resulting intensity levels when the 0-phase SBs and the π-phased SBs are applied to the original mask layout.

An aerial image simulation was performed to confirm the benefit/advantages associated with the application of phase-balanced SB features in accordance with the present invention. FIG. 11 shows the intensity levels of the main contact features without the phase-balanced SB features (i.e., without any scattering bars) applied to the mask pattern. As shown by FIG. 11, the intensity levels are approximately 1.8. FIG. 12 illustrates the resulting intensity levels when the 0-phased SBs and π-phased SBs are applied to mask layout. As shown by FIG. 12, the main contact features have significantly brighter intensity levels (approximately 0.35) when with phase-balanced SB features are contained in the mask. Indeed, the intensity levels are nearly double the relative intensity level for the main contact features obtained without the use of the phase-balanced SB features.

It is noted that to achieve print-to-target-size, the contact hole features must sometimes also go through the subsequent mode OPC step in the presence of the phase-balanced SB features. In other words, SBs are assist features which help the contact hole printing, but the contact sizes can still be off from the desired the target sizes. In such a case, in order to make the printed contact sizes closer to designed target sizes, additional OPC steps can be applied to the model process.

Figure 13:
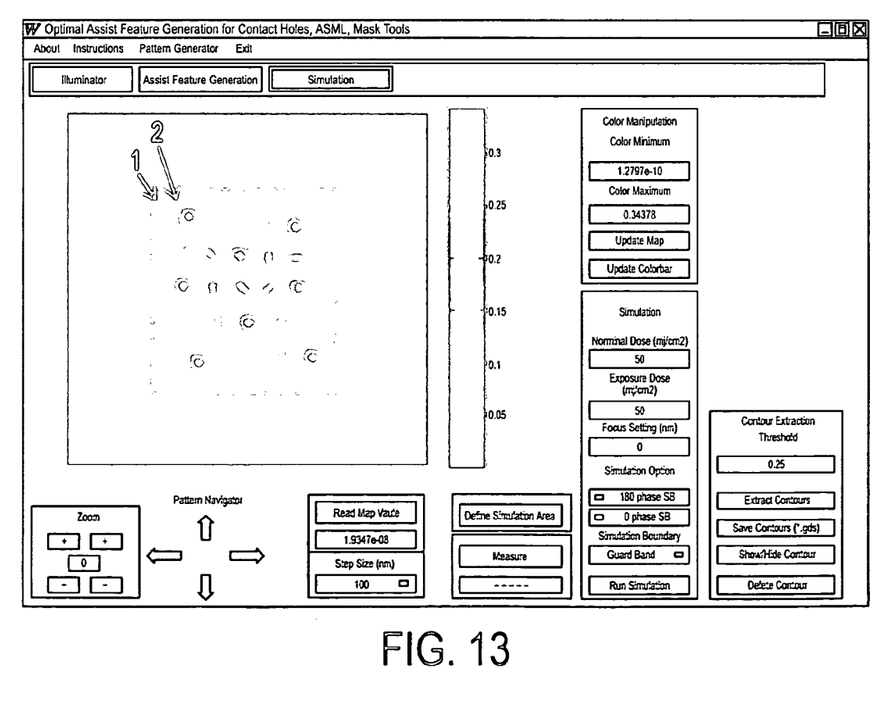
FIG. 13 shows the aerial image for a mask containing the main contact features and only the 0-phase SB features.

In order to further illustrate the effect of balancing the 0-π SB phase features, FIG. 13 shows the aerial image for a mask containing the main contact features and only the 0-phase SB features. Comparing the aerial image of FIG. 13 to the aerial image of FIG. 12, it is clear that intensity levels at 0-phase SB locations are sufficiently suppressed overall, see, example site 1 of 0-phase SB in FIG. 13 versus the corresponding site of FIG. 12 when the "balanced" π-phase SB features are included in the mask layout. As for the intensity levels of the main contact hole features, the example site 2 shows little degradation from FIG. 13 to FIG. 12. This is achieved due to 0-π phase balancing of the present invention. It is further noted that it has been determined that adjusting the size of the exclusion zone of the main contact features can effectively optimize the 0-π SB phase balancing. It is also noted that the π phase SBs are generated using the interference map of 0-phase SBs and with a certain range beyond the main contact features excluded. The range of exclusion is an effective variable for adjusting the balance for the 0-π SBs.

Also, for the dense feature regions, the size of 0-phase SBs may be further restricted because otherwise there would not be sufficient room to insert the π-phase SBs. However, due to the proximity effect, it has been determined that it is possible to achieve comparable printing results by adjusting the size of 0-phase SBs. As for more isolated contact hole features, the size of 0-phase SB features is subject to less stringent restrictions and a wider range of π-phase SBs can be utilized for phase balancing. Therefore, in the more isolated regions, both 0-phase SB features and π-phase SB features can be enlarged to further enhance the printability of the isolated contacts as long as they are balanced. With current geometry manipulation engines, automatic labeling and size adjustment for those phase balanced SBs can be readily accomplished.

Figure 14:
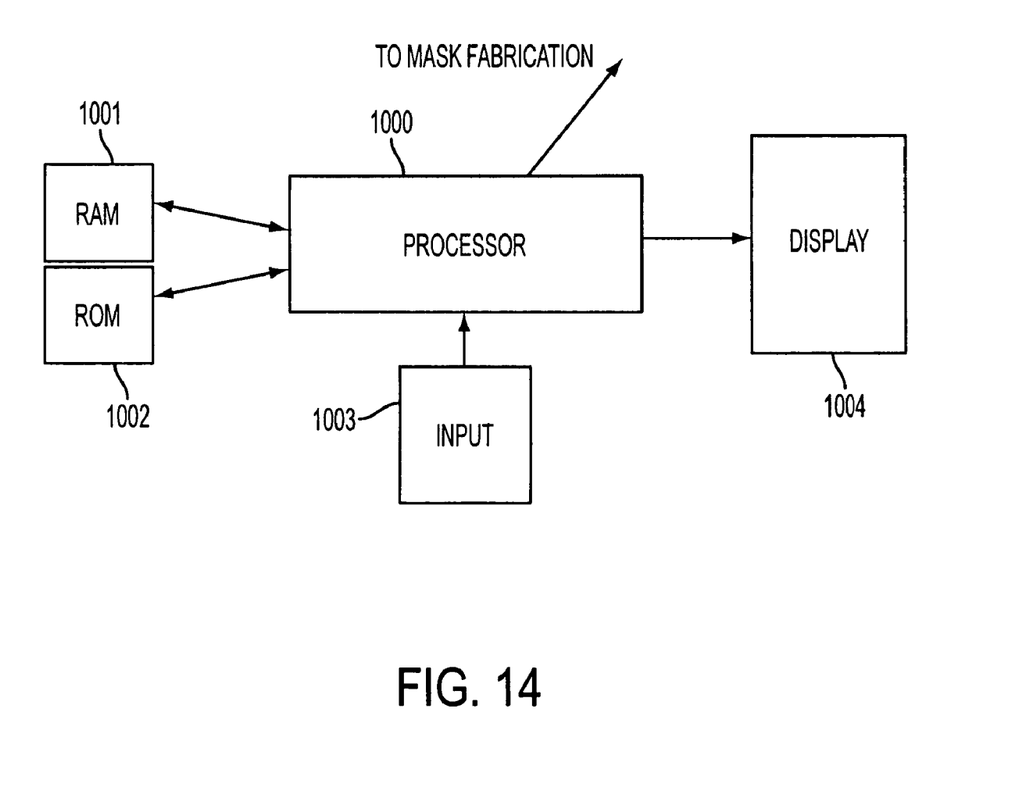
FIG. 14 illustrates an exemplary processing system for implementing the mask design method of the present invention.

FIG. 14 illustrates an exemplary processing system for implementing the mask design method of the present invention. As illustrated in FIG. 14, an exemplary processing system may contain a processor 1000 which receives input from an input 1003. Processor 1000 may be a conventional microprocessor or may be a specially designed processing unit, such as an EEPROM or EPROM or a fabricated integrated circuit. Input 1003 may be any type of electronic input device, such as a keyboard or a mouse, or may be a memory or internet connection. Processor 1000 preferably retrieves stored protocols from ROM 1002 and RAM 1001, such as protocols to implement the methods detailed above for generating a mask layout in accordance with the present invention, and stores information on RAM 1001. The calculated results (e.g., mask design) of processor 1000 may be displayed on display 1004 and may be provided to a mask fabrication unit.

Figure 15:
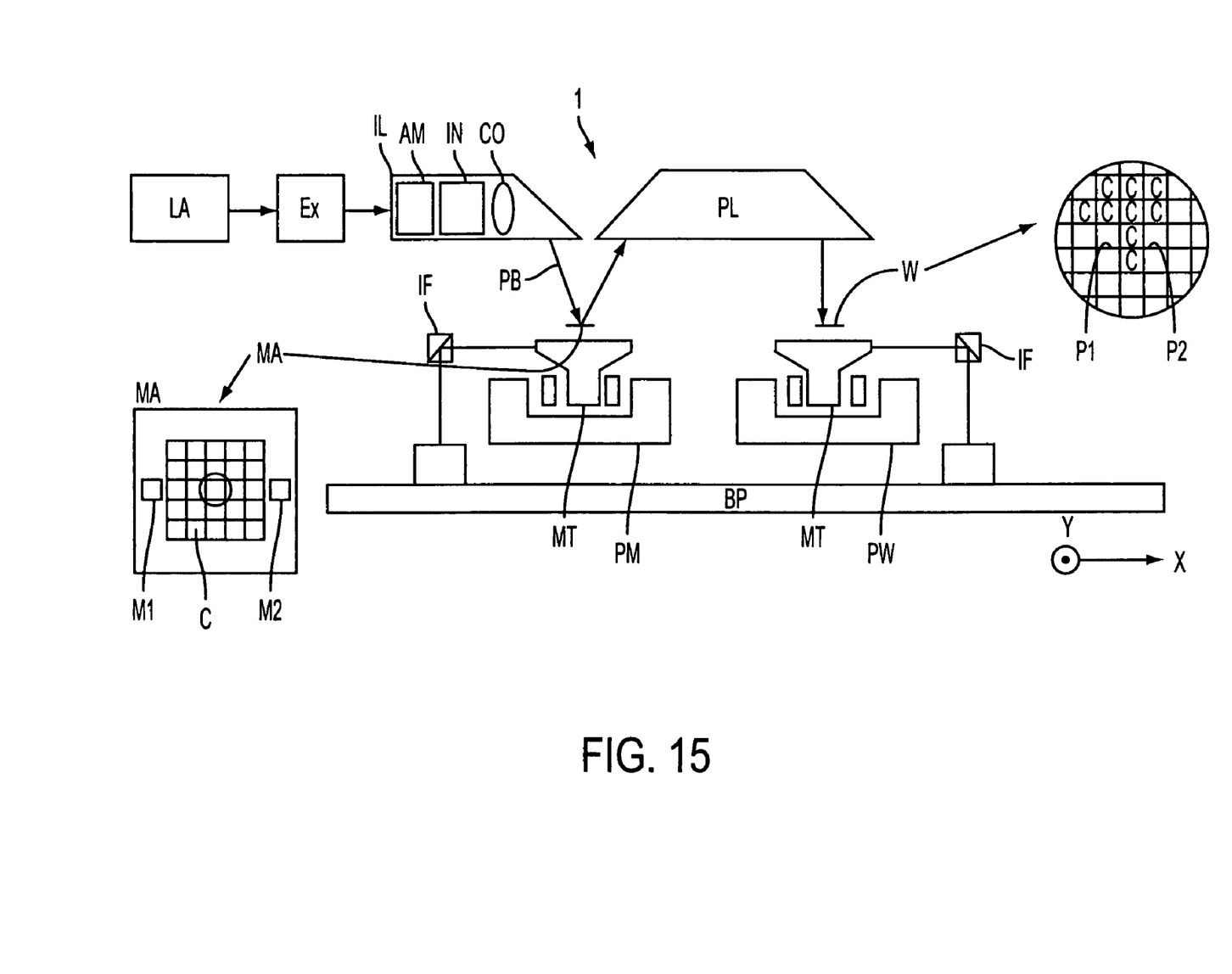
FIG. 15 schematically depicts a lithographic projection apparatus suitable for use with the masks designed with the aid of the current invention.

FIG. 15 schematically depicts a lithographic projection apparatus suitable for use with the masks designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp, excimer laser or plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 15 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 15. However, in the case of a wafer stepper (as opposed to a step-and-scan tool) the mask table MT may just be connected to a short stroke actuator, or may be fixed.

The depicted tool can be used in two different modes:

- In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The software functionalities of a computer system involve programming, including executable code, may be used to implement the above described imaging model. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

In addition, the concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

It is also noted that while the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A method of generating a mask design having optical proximity correction features disposed therein, said method comprising the steps of:

obtaining a target pattern having features to be imaged on a substrate;

generating a first interference map based on said target pattern, said first interference map defining areas of constructive interference between at least one of said features to be imaged and a field area adjacent said at least one feature;

placing a first set of assist features having a first phase in the mask design based on the areas of constructive interference defined by said first interference map;

generating a second interference map based on said first set of assist features, said second interference map defining areas of constructive interference between assist features of said first set of assist features and a field area adjacent at least one of said assist features of said first set of assist features; and placing a second set of assist features having a second phase in the mask design based on the areas of constructive interference defined by the second interference map, wherein said first phase does not equal said second phase.

2. The method of claim 1, wherein each assist feature in said second set of assist features exhibits an 180° phase-shift relative to each assist feature in said first set of assist features.

3. The method of claim 1, further comprising the step of defining an exclusion region which surrounds at least one feature in said target pattern, wherein neither an assist feature from the first set of assist features nor an assist feature from the second set of assist features is positioned within the exclusion region.

4. The method of claim 1, wherein the assist features in the first set of assist features enhance the printing of said features of the desired target and are disposed in constructive areas of interferences, and assist features in the second set of assist features negate constructive interference occurring between assist features contained in the first set of assist features.

5. The method of claim 1, wherein the first interference map defines intensity levels of the field relative to the featured to be images, said first interference map being capable of representing both positive and negative values of intensity relative to a non-zero DC level, wherein regions of the field having intensity values which are positive relative to said non-zero DC level correspond to constructive areas of interference, and regions of the field having intensity values which are negative relative to said non-zero DC level correspond to destructive areas of interference areas.

6. The method of claim 1, wherein the second interference map defines intensity levels of the field relative to the first set of assist features, said second interference map being capable of representing both positive and negative values of intensity relative to a non-zero DC level, wherein regions of the field having intensity values which are positive relative to said non-zero DC level correspond to constructive areas of interference, and regions of the field having intensity values which are negative relative to said non-zero DC level correspond to destructive areas of interference areas.

7. A computer program product for controlling a computer comprising a recording medium readable by the computer, means recorded on the recording medium for directing the computer to generate files corresponding to a mask for use in an lithographic imaging process, said generation of said files comprising the steps of:

obtaining a target pattern having features to be imaged on a substrate;

generating a first interference map based on said target pattern, said first interference map defining areas of constructive interference between at least one of said features to be imaged and a field area adjacent said at least one feature;

placing a first set of assist features having a first phase in the mask design based on the areas of constructive interference defined by said first interference map;

generating a second interference map based on said first set of assist features, said second interference map defining areas of constructive interference between assist features of said first set of assist features and a field area adjacent at least one of said assist features of said first set of assist features; and placing a second set of assist features having a second phase in the mask design based on the areas of constructive interference defined by the second interference map, wherein said first phase does not equal said second phase.

8. The computer program product of claim 7, wherein each assist feature in said second set of assist features exhibits an 180° phase-shift relative to each assist feature in said first set of assist features.

9. The computer program product of claim 7, wherein said generator of said files further comprising the step of defining an exclusion region which surrounds at least one feature in said target pattern, wherein neither an assist feature from the first set of assist features nor an assist feature from the second set of assist features is positioned within the exclusion region.

10. The computer program product of claim 7, wherein the assist features in the first set of assist features enhance the printing of said features of the target and are disposed in constructive areas of interferences, and assist features in the second set of assist features negate constructive interference occurring between assist features contained in the first set of assist features.

11. The computer program product of claim 7, wherein the first interference map defines intensity levels of the field relative to the featured to be images, said first interference map being capable of representing both positive and negative values of intensity relative to a non-zero DC level, wherein regions of the field having intensity values which are positive relative to said non-zero DC level correspond to constructive areas of interference, and regions of the field having intensity values which are negative relative to said non-zero DC level correspond to destructive areas of interference areas.

12. The computer program product of claim 7, wherein the second interference map defines intensity levels of the field relative to the first set of assist features, said second interference map being capable of representing both positive and negative values of intensity relative to a non-zero DC level, wherein regions of the field having intensity values which are positive relative to said non-zero DC level correspond to constructive areas of interference, and regions of the field having intensity values which are negative relative to said non-zero DC level correspond to destructive areas of interference areas.

* * * * *